United States Patent [19]

Takahashi et al.

[11] Patent Number: 4,526,835
[45] Date of Patent: Jul. 2, 1985

[54] MULTI-LAYER PRINTED CIRCUIT BOARD AND PROCESS FOR PRODUCTION THEREOF

[75] Inventors: Akio Takahashi, Hitachiota; Takeshi Shimazaki, Hitachi; Motoyo Wajima, Hitachi; Hirosada Morishita, Hitachi, all of Japan

[73] Assignee: Hitachi, Ltd., Tokyo, Japan

[21] Appl. No.: 541,248

[22] Filed: Oct. 12, 1983

Related U.S. Application Data

[63] Continuation-in-part of Ser. No. 351,764, Feb. 24, 1982, abandoned.

[30] Foreign Application Priority Data

Mar. 4, 1981 [JP] Japan .................................. 56-29909

[51] Int. Cl.³ ...................... B32B 27/38; B32B 27/28; C09J 5/02
[52] U.S. Cl. ..................................... 428/413; 156/248; 156/307.1; 428/473.5; 428/901; 525/403
[58] Field of Search .................... 428/901, 473.5, 413; 156/307.1, 248

[56] References Cited

U.S. PATENT DOCUMENTS 4,338,149  7/1982  Quaschner ........................ 156/248
4,482,703  11/1984  Takahashi et al. ................. 528/322

Primary Examiner—Thomas J. Herbert
Attorney, Agent, or Firm—Antonelli, Terry & Wands

[57] ABSTRACT

A multi-layer printed circuit board produced by laminating a plurality of unit circuit sheets via prepreg resin sheets, the cured resin in said unit circuit sheet having a glass transition temperature $Tg_1$, said prepreg resin sheets having been prepared by impregnating a reinforcing substrate with a resin composition which can be cured at a temperature equal to or lower than both the glass transition temperature of $Tg_1$ and that of $Tg_2$ of the resin in the prepreg resin sheet after cured, and binding the laminated sheets with heating under pressure at a temperature equal to or lower than both the temperatures of $Tg_1$ and $Tg_2$, has excellent dimensional stability, heat resistance and through-hole reliability.

35 Claims, 6 Drawing Figures

MULTI-LAYER PRINTED CIRCUIT BOARD AND PROCESS FOR PRODUCTION THEREOF

CROSS-REFERENCE TO RELATED APPLICATIONS

This application is a continuation-in-part of application Ser. No. 351,764 filed Feb. 24, 1982 and now abandoned.

BACKGROUND OF THE INVENTION

This invention relates to a multi-layer printed circuit board with high dimensional precision and a process for the production thereof.

An increasing tendency is seen recently to greater compactness and densification of the multi-layer printed circuit boards used in the industrial and business machines such as computers. In line with this, there are required higher heat resistance of the boards to cope with increase of heat release from elements, e.g., LSI, in use, finer pattern to accommodate increased wiring density, higher dimensional stability between layers in response to the increased number of layers and higher through-hole reliability. As a material that can answer to such requirements, polyimide type materials have come to be used in place of the conventional epoxy type materials which are rather poor in heat resistance. Dominant among such polyimide materials are aminobismaleimide resins and their epoxy-modified resins. In production of a printed circuit board, such an epoxy or polyimide resin is impregnated in reinforcing fabrics to form prepregs and separately made unit circuit sheets are laminated via such prepreg resin layers. The heating temperature used in the heat and pressure molding for lamination is usually of the order of 170°–180° C., and the resultantly obtained cured product has a glass transition temperature (Tg) of the order of 120°–160° C. which is lower than said molding temperature. Glass transition temperature (Tg) is used as an index of heat resistance, but Tg of the order of 120°–160° C. mentioned above cannot provide satisfactory heat resistance. In order to obtained sufficient heat resistance, it needs to perform additional 2- to 3-hour post-curing by heating the molding to 200°–240° C. to elevate Tg to a level above 170° C., preferably to a level of around 200° C. However, post-curing under such elevated temperatures tends to cause dislocation among the layered circuit boards and the reduction of adhesive strength between the inner copper foil and prepreg, resulting in an adverse effect to the dimensional precision of the product. While removal of such evil effects of post-curing has been desired, no positive solution to this problem has been available to date.

In the hope of solving such problem, the present inventors have pursued studies on a relationship between the heating temperature ($T_L$) in the working process, including the heat and pressure molding for lamination of circuit boards and post-curing, and the glass transition temperature (Tg) of the cured resin in the boards, and found that said problem can be solved by a consideration from such a new standpoint. The present invention was reached as a result of such studies.

SUMMARY OF THE INVENTION

According to the present invention, post-curing required to perform in succession to the heat and pressure molding for lamination in the prior art is unnecessitated and said heat and pressure molding can be accomplished at a relatively low temperature used heretofore, and further the cured resin in the molding has Tg which is high enough to unnecessitate any post-curing, allowing obtainment of a heat resistant multi-layer printed circuit board with high dimensional precision and high through-hole reliability.

The present invention provides a multi-layer printed circuit board produced by laminating, via prepreg resin sheets, a plurality of unit circuit sheets which have circuit layers on at least one surface thereof and contain a cured impregnated resin and subjecting said laminate to a heat and pressure treatment to cure the resin in said prepreg resin sheets, characterized by using a resin which is curable at a temperature equal to or lower than both the glass transition temperature ($T_{g1}$) of the cured resin in said unit circuit sheets and the glass transition temperature ($T_{g2}$) of the resin in said prepreg resin sheets after cured, and by performing the heat and pressure molding at a temperature below said both $T_{g1}$ and $T_{g2}'$ and a process for producing such a multi-layer printed circuit board.

BRIEF DESCRIPTION OF THE DRAWINGS

In the accompanying drawings.

DESCRIPTION OF THE PREFERRED EMBODIMENTS

Figure 1:
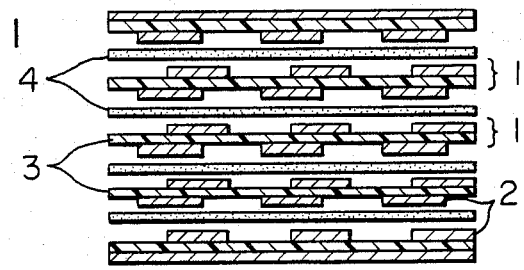
FIG. 1 is a sectional view illustrating a laminate of unit circuit sheets as laminated with the medium of prepreg resin sheets for forming a multi-layer printed circuit board according to this invention.

The present invention is first described by referring to FIG. 1. Each unit circuit sheet 1 comprises a resin-impregnated sheet 3 (said resin being cured) having circuit layers 2 on at least one surface thereof. As the resin used for the resin-impregnated sheet 3 of each unit circuit sheet 1, there may be exemplified the addition polymerization type polyimide resins such as those prepared from polymaleimides and diamines, dehydration condensation type polyimide resins, triazine type resins such as BT resins (mfd, by Mitsubishi Gas-Chemical Co., Inc., Japan), cyanate series resins (mfd. by Bayer A. G., etc.). It is also possible to use the same resin compositions as used for preparing prepreg resin sheets mentioned below.

Each prepreg resin sheet 4 can be formed by impregnating a reinforcing substrate, for example, a reinforcing fiber cloth such as glass cloth, carbon fibers, polyamide fibers, etc., with a specific polyimide resin composition such as shown below by dissolving the composition in an ordinary varnish solvent, and drying the same in a usual way (with the varnish solvent being evaporated away at 120°–150° C.).

Said polyimide resin composition comprises:
(I) a prepolymer obtained by preliminarily reacting under heating
  (a) a bisimide of the formula:

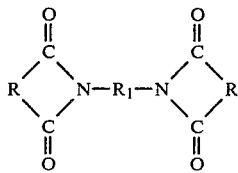

wherein R is a divalent organic group having at least one carbon-carbon double bond; and $R_1$ is a divalent organic group having at least two carbon atoms, and (b) a diamine of the formula:

$$H_2N-R_2-NH_2 \quad (2)$$

wherein $R_2$ is a divalent organic group having at least two carbon atoms, (II) an epoxy resin, and (III) at least one amine compound selected from the group consisting of s-triazine type amine compounds of the formula:

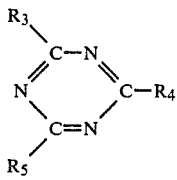

wherein $R_3$, $R_4$ and $R_5$ are selected from the group consisting of hydrogen, halogen, a hydrocarbon group, an amino group, a hydroxyl group, an amino-substituted hydrocarbon group, a hydroxyl-substituted hydrocarbon group and a hydrocarbon-substituted amino group, and at least one of $R_3$, $R_4$ and $R_5$ is an amino group or an amino-substituted hydrocarbon group, and dicyandiamide.

The glass transition temperature ($Tg_1$) of the polyimide resin obtained from a polymaleimide and a diamine in the unit circuit sheets after curing is mostly in the range of 180°–300° C., while the glass transition temperature ($Tg_2$) of the polyimide resin composed of said components (I), (II) and (III) in the prepreg resin sheets after curing is also in the range of 180°–300° C., but its curable temperature is below said range of $Tg_2$.

Now, the resins used for the prepreg resin sheets consisting of said components (a) and (b) are described in detail.

As examples of the bisimides of component (a) represented by the formula:

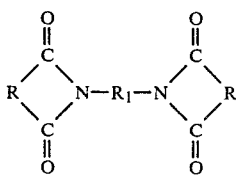

wherein R is as defined above and preferably having 2 to 10 carbon atoms; and $R_1$ is as defined above and preferably having 2 to 40 carbon atoms, there may be cited N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-methylenebis(3-chloro-p-phenylene)bismaleimide, N,N'-4,4'-diphenylsulfonebismaleimide, N,N'-4,4'-dicyclohexylmethanebismaleimide, N,N'-α,α'-4,4'-dimethylenecyclohexanebismaleimide, N,N'-m-methaxylenebismaleimide, N,N'-4,4'-diphenylcyclohexanebismaleimide, etc. These compounds may be used either singly or in combination. The effect of this invention can be well attained by using with said bismaleimide a polyvalent maleimide of the formula:

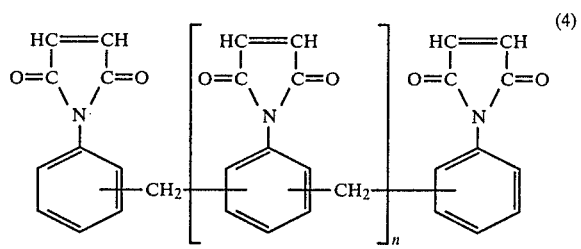

wherein n is 0.1 to 3.0 on the average.

As examples of the diamines, or component (b), represented by the formula:

$$H_2N-R_2-NH_2 \quad (2)$$

wherein $R_2$ is as defined above and preferably having 2 to 40 carbon atoms, there may be cited the following: 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, benzidine, 4,4'-diaminophenyl oxide, 4,4'-diaminodiphenylsulfone, bis(4-aminophenyl)phenylphosphone oxide, bis(4-aminophenyl)methylamine, 1,5-diaminonaphthalene, m-xylenediamine, p-xylenediamine, hexamethylenediamine, 6,6'-diamine-2,2'-pyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadizole, 2,5-bis(m-aminophenyl)thiazo-(4,5-d)thiazole, 5,5'-di(m-aminophenyl)-2,2'-bis(1,3,4-oxadiazolyl), 4,4'-diaminodiphenylether, 4,4'-bis(p-aminophenyl)-2,2'-dithiazole, m-bis(4-p-aminophenyl-2-thiazolyl)-benzene, 4,4'-diaminobenzanilide, 4,4'-diaminophenyl benzoate, N,N'-bis(4-aminobenzyl)-p-phenylenediamine, 4,4'-methylenebis(2-chloroaniline), etc. These compounds may be used either alone or in admixture.

In the present invention, a bisimide of the formula (1) and a diamine of the formula (2) are preliminarily reacted at 80°–160° C. for 10–90 minutes to form a prepolymer (I). The molar ratio of bisimide to diamine is preferably within the range of 1:01 to 1:1. A too small amount of amine leads to very poor curing characteristics, causing insufficient curing at the desired molding temperature, while an excess amount of amine results in a short useful life as varnish and prepreg.

As the epoxy resin (II) used in the present invention, there may be employed epoxy compounds having at least two epoxy groups, for example, bifunctional epoxy compounds such as bisphenol A diglycidyl ether, 3,4-epoxycyclohexylmethyl-3,4-epoxycyclohexane carboxylate, 4,4'-(1,2-epoxyethyl)biphenyl, 4,4'-di(1,2-epoxyethyl)diphenyl ether, resorcindiglycidyl ether, bis(2,3-epoxycyclopentyl) ether, N,N'-m-phenylenebis(4,5'-epoxy-1,2-cyclohexanedicarboxyimide), etc., and trifunctional or higher-order polyfunctional epoxy compounds such as triglycidyl compounds of p-aminophenol, 1,3,5-tri(1,2-epoxyethyl)benzene, tetraglycidoxytetraphenylethane, polyglycidyl ether of phenol-formaldehyde novolak resin, etc. It is also possible to use epoxy compounds having a hydantoin skeleton or halogen-containing epoxy compounds.

Such an epoxy resin may be used directly for preparing a prepreg resin composition, or it may be preliminarily reacted with a prepolymer (I) obtained from said bisimide and diamine combination. It is desirable that said epoxy resin is used in an amount within the range of 15-70% by weight based on said resin composition (that is, the total amount of the prepolymer (I) and epoxy resin). A too small amount of epoxy resin leads to poor curing characteristics, making it unable to obtain the desired properties of the cured resin by curing at a temperature of, for example, around 170° C., while too much epoxy resin loading results in poor heat resistance of the cured laminate resin.

Another component (III) of the prepreg resin composition used in this invention is at least one amine compound selected from the group consisting of amine compounds having an s-triazine ring represented by the formula:

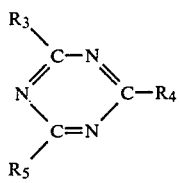

(3)

wherein $R_3$, $R_4$ and $R_5$ are as defined before and dicyandiamide.

Examples of the amine compounds of the formula (3) having an s-triazine ring are: melamine, 2-amino-s-triazine, 2-amino-4-phenyl-s-triazine, 2-amino-4-phenyl-s-triazine, 2-amino-4,6-diethyl-s-triazine, 2-amino-4,6-diphenyl-s-triazine, 2-amino-4,6-bix(p-methoxyphenyl)-s-triazine, 2-amino-4-anilino-s-triazine, 2-amino-4-phenoxy-s-triazine, 2-amino-4-chloro-s-triazine, 2-amino-4-aminomethyl-6-chloro-s-triazine, 2-(p-aminophenyl)-4,6-dichloro-s-triazine, 2,4-diamino-s-triazine, 2,4-diamino-6-methyl-s-triazine, 2,4-diamino-6-phenyl-s-triazine, 2,4-diamino-6-benzyl-s-triazine, 2,4-diamino-6-(p-aminophenyl)-s-triazine, 2,4-diamino-6-(m-aminophenyl)-s-triazine, 4-amino-6-phenyl-s-triazine-2-ol, 6-amino-s-triazine-2,4-diol, etc. These amine compounds may be used either singly or in combination.

Said amine compound is preferably used in an amount in the range of 0.2-25 parts by weight based on 100 parts by weight of the sum of the components (I) and (II) of the resin composition. It was found in this invention that these amine compounds of the formula (3) having an s-triazine ring and dicyandiamide, when blended as a curing agent in the composition comprising a bisimidediamine prepolymer (I) and an epoxy resin (II) or in a prepolymer obtained by preliminarily reacting said both components, show a so-called latent curing characteristic, that is, when they are blended as said above, the reaction advances very slowly at a temperature below 150° C. while progresses very rapidly at a temperature above 160° C., in contrast with the ordinary amine type curing agents. Therefore, they can be favorably used for the preparation of the products such as prepregs which are required on one hand to have a long pot life and also required on the other hand to show a desired resin fluidity during molding and cure sufficiently at a molding temperature of around 170° C. Although both the amine compounds having an s-triazine and dicyandiamide show the similar performance, the former are preferred because of their better effect in this invention.

In the present invention, the following excellent effect is provided by use of the polyimide resin composition comprising the prepolymer (I) containing said materials (a) and (b) and further comprising said components (II) and (III). That is, desired adhesion molding (multi-layer lamination) can be accomplished under the conditions of about 160°-180° C. for 60-90 minutes, which are on a par with the preparation conditions for the ordinary epoxy prepregs. Further, the glass transition temperature of the cured resin can reach over 180° C. by one molding operation. This is a surprising improvement in comparison with the conventional polyimide resins with which it has been possible to merely give a cured resin laminate with Tg of the order of 120°-160° C. under such adhesion (laminating) molding conditions. Thus, the process of this invention dispenses with the post-cure at an elevated temperature, which has been a serious problem in the preparation of the polyimide prepregs in the prior art. This, accordingly, can solve problems such as reduction of adhesive strength between inner copper foil and prepreg, lowering of dimensional precision, etc., resulting from post-cure at an elevated temperature in the production of the conventional imide resin multi-layer printed circuit boards. Further, the heat resistant properties of the multi-layer printed circuit board, that is, soldering heat resistance, glass transition temperature, etc., are not affected as heat resistance peculiar to polyimide resins is maintained at its original level. Particularly, considering that soldering heat resistance at 300° C. has influences not only on heat resistance of the resin but also on said inner copper foil-prepreg adhesive strength, the multi-layer printed circuit board of this invention is superior to the conventional polyimide type printed circuit boards in this respect, too.

Moreover, the polyimide resin composition used in this invention has an excellent pot life at room temperature and the reaction advances very slowly at around the varnish-solvent-drying temperature (120°-150° C.) during production of prepregs, that is, said composition has so-called latent curing characteristics, so that there is no likelihood of the reaction advancing too fast. Therefore, the produced prepregs show good flow characteristics at the molding temperature of the level used for epoxy resins and hence are very excellent in moldability. This, too, contributes to the improvement of dimensional precision in the present invention.

As mentioned above, all sheets may be operable so long as satisfying the relationship (conditions) between the curable temperature of prepreg resin sheets and the glass transition temperatures of $Tg_1$ and $Tg_2$. Therefore, resins which satisfy the above-mentioned conditions can be used in this invention irrespective of their kinds. From this standpoint, there become useful the following combinations of resins, for example:

(i) A combination of (A) as resin for unit circuit sheet a resin containing polymaleimide and (B) as resin for prepreg resin sheet a composition containing dicyanamide or dicyandiamide and an imidazole or an aromatic diamine, or a prepolymer thereof.

(ii) A combination of the same compositions or prepolymers thereof as used in (i) (B) both in (A) as resin for unit circuit sheet and in (B) as resin for prepreg resin sheet.

(iii) A combination of (A) as resin for unit circuit sheet the same composition or prepolymer thereof as used in (i) (B), and (B) as resin for prepreg resin sheet a composition containing polymaleimide mentioned above, an aromatic diamine, an epoxy resin and a s-triazine type amine compound, or a prepolymer thereof.

(iv) A combination of (A) as resin for unit circuit sheet the same resin or prepolymer thereof as used in (iii) (B) and (B) as resin for prepreg resin sheet the same composition or prepolymer thereof as used in (iii) (A).

In the above, as the composition containing dicyanamide or prepolymer thereof, there can be used those disclosed in British Pat. No. 1,322,332, U.S. patent application Ser. No. 435,766, filed Oct. 20, 1982, now U.S. Pat. No. 4,482,703. Japanese Patent Application No. 144736/82, etc.

The multi-layer printed circuit board according to this invention is produced by laminating a plurality of said unit circuit sheets by interposing a corresponding number of said prepreg resin sheets, and then subjecting the laminate to molding under pressure with heating at a temperature equal to or lower than both the glass transition temperature $Tg_1$ of the cured resin in the unit circuit sheets and the glass transition temperature $Tg_2$ attained by the resin in the prepreg resin sheets when said resin is cured. It is desirable that both $Tg_1$ and $Tg_2$ are 170° C. or higher, more preferably above 180°–190° C., and such desirable glass transition temperatures $Tg_1$ and $Tg_2$ can be well obtained in this invention by using a molding temperature of the order of 160°–180° C. which temperature range has been generally employed for lamination heating in the art. That the glass transition temperature of the resin in the circuit board can be raised to 170° C. or higher by using a relatively low molding temperature and without post-curing is extremely advantageous as it can markedly enhance productivity in industrial production.

The pressure used in heat and pressure molding for multi-layer lamination is preferably within the range of 5 to 30 kg/cm².

The present invention is described in further detail hereinbelow by way of the following Examples, in which all "parts" and "%" are by weight unless otherwise specified.

EXAMPLE 1

An inner layer circuit pattern was formed by photo-etching on a copper-clad laminate prepared by using a prepolymer derived from N,N'-4,4'-diphenylmethanebismaleimide and 4,4'-diaminodiphenylmethane and also using a glass cloth and copper foil as substrate (the laminate having a thickness of 0.27 mm and coated with 70 μm thick copper foil on both sides; $Tg_1$: 220° C.), and then the copper surface of the circuit pattern was treated according to the following process to form a two-sided wiring unit circuit sheet.

PROCESS

Trichloroethylene washing→immersion in copper chloride/hydrochloric acid solution (1) (40°–50° C., 2 min.)→washing with water→immersion in 10% sulfuric acid (room temperature, 2 min.)→washing with water-→air blowing→immersion in oxide layer forming solution (2) (70°–80° C., 2 min.)→washing with water→drying (100° C., 30 min.)

Composition of solutions (1) and (2):

(1) 300 g concentrated hydrochloric acid, 50 g cupric chloride and 650 g distilled water.

(2) 5 g sodium hydroxide, 10 g trisodium phosphate, 30 g sodium chlorite and 955 g distilled water.

Figure 2:
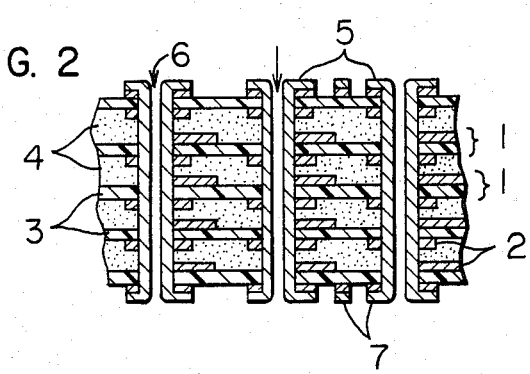
FIGS. 2 to 4 are sectional views of the multi-layer printed boards having through-holes as produced according to the embodiments of this invention.

The thus formed unit circuit sheets were then subjected to adhesion molding along with the prepreg resin sheets (A) specified below, under the conditions of 170° C., 20 kg/cm² (pressure) and 80 minutes, in the manner illustrated in FIG. 1 to form a multi-layer laminate (with five unit circuit sheet layers). In FIG. 1, numeral 1 indicates unit circuit sheets, 2 circuits, 3 resin-impregnated sheets (with resin cured), and 4 prepreg resin sheets. Then through-holes were formed for electro-conduction between the circuits on the respective layers of the multi-layer laminate as shown in FIG. 2, and after applying through-hole plating, the outermost layer circuit was formed by etching to produce a multi-layer printed circuit board. In FIG. 2, numeral 5 indicates through-hole plating films, 6 through-holes and 7 outermost layer circuit.

PREPARATION OF PREPREG RESIN SHEET (A)

40 Parts of N,N'-4,4'-diaminodiphenylmethanebismaleimide and 10 parts of 4,4'-diaminodiphenylmethane were reacted at 90°–120° C. for 40 minutes, and then this reaction mixture was mixed with 50 parts of a cresol novolak type epoxy resin (epoxy equivalent weight: approx. 230) and reacted at 80°–110° C. for 30 minutes to prepare a prepolymer. 100 Parts of this prepolymer and 6 parts of benzoguanamine were dissolved in a methyl ethyl ketone/methyl Cellosolve (1:1 by weight) mixed solvent to form a varnish with 50% solid content. This varnish was used for impregnating an aminosilane-treated glass cloth (0.1 mm thick, mfd. by Nitto Boseki Co., Ltd., Japan), followed by drying at 130°–140° C. for 10 minutes to make a prepreg resin sheet with 40–50% resin content.

COMPARATIVE EXAMPLE 1

A multi-layer printed circuit board was produced by carring out the same operations as in Example 1 described above except that the prepreg resin sheets (B) specified below were used instead of those (A) employed in Example 1, that the adhesion molding time was prolonged from 80 minutes to 100 minutes and that an additional 180-minute post-curing treatment was conducted at 220° C. for elevating the glass transition temperature Tg.

PREPARATION OF PREPREG RESIN SHEET (B)

A prepolymer obtained by preliminarily reacting 78 parts of N,N'-4,4'-diaminodiphenylmethanebismaleimide and 22 parts of 4,4'-diaminodiphenylmethane at 120°–150° C. for 20 minutes was formed into a varnish with about 50% solids by using N-methyl-2-pyrrolidone as solvent, and this varnish was used for impregnating an aminosilane-treated glass cloth (the same as used in Example 1) and dried at 140°–160° C. for 10 minutes to obtain a prepreg resin sheet with 45–50% resin content.

EXAMPLE 2

A multi-layer printed circuit board was produced in the same way as Example 1 except for use of the following unit circuit sheets.

Unit circuit sheet: prepared by using 60 parts of a prepolymer formed from N,N'-4,4'-diaminodiphenylmethanebismaleimide and 4,4'-diaminodiphenylmethane, 40 parts of a phenol novlak type epoxy resin (epoxy equivalent weight: approx. 180) and 1.5 parts of dicyandiamide as resin composition in combination with a glass cloth and copper foil (sheet thickness: 0.27 mm, both sides of the sheet being coated with 70 μm thick copper foil; $Tg_1$: 230° C.).

EXAMPLE 3

A multi-layer printed circuit board was produced by using the same type of the unit circuit sheets as employed in Example 2 while using the below-specified prepreg resin sheets (C) and by performing the laminate-molding and through-hole-forming operations under the same conditions as in Example 1 (the adhesion molding time being, however, prolonged to 100 minutes).

PREPARATION OF PREPREG RESIN SHEET (C)

32 Parts of N,N'-4,4'-diaminodiphenylmethanebismaleimide, 8 parts of a maleimide of the formula:

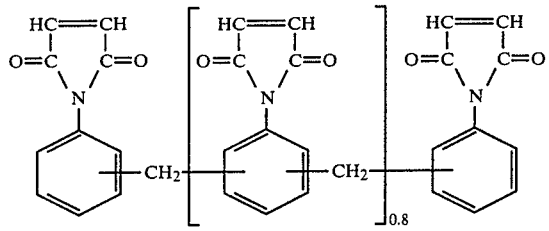

and 10 parts of 4,4-diaminodiphenylmethane were heated and preliminarily reacted at 100°–140° C. for 30 minutes to prepare a prepolymer. Then 50 parts of this prepolymer, 50 parts of a bisphenol A type epoxy resin (epoxy equivalent weight: 188) and 3.5 parts of dicyandiamide were dissolved in N-methyl-2-pyrrolidone to form a varnish with 50% solid content. Then an aminosilane-treated glass cloth (0.1 mm thick) was impregnated with said varnish and dried at 140°–160° C. for 10 minutes to make a prepreg resin sheet (C) with 50% resin content.

The principal properties, as determined in the following ways, of the four multi-layer printed circuit board specimens produced in Examples 1–3 and Comparative Example 1 are shown in Table 1. Also shown in Table 1 are the determined properties of a commercially available epoxy type multi-layer printed circuit board using an epoxy resin for both unit circuit sheets and prepregs. The properties were determined in the following ways.

Soldering heat resistance:

Each multi-layer printed circuit board was cut to a test piece of 100×150 mm and floated in a soldering bath (300° C.), and the time (sec.) that passed till occurrence of any abnormality such as swelling in the board was measured.

Inner copper foil adhesive strength:

The adhesive force between the inner copper foil and the prepreg layer was expressed by the peel strength (g/cm) measured according to JIS C-6481.

Positional shift:

The maximum value of positional shift between pad and through-hole in each layer was given.

Glass transition temperature Tg:

A coefficient of thermal expansion along the thickness of the laminate (10 mm square) was measured at a heating rate of 2° C./min, and the temperature corresponding to the inflexion point on the thermal expansion coefficient-temperature curve was given as Tg.

TABLE 1

| Example No. | Glass transition temp. (°C.) | Soldering heat resistance (sec.) | Inner copper foil adhesive strength (g/cm) | Maximum positional shift (μm) |
|---|---|---|---|---|
| Example 1 | 210 | over 180 | 1,300 | 80 |
| Comparative Example 1 | 210 (140)*[1] | 100 | 500 | 160 |
| Example 2 | 215 | over 180 | 1,200 | 75 |
| Example 3 | 190 | over 180 | 1,400 | 76 |
| Commercial product*[2] | 125 | 20–30 | 1,200 | 200 |

(Notes)
*[1] The figure in the parentheses is the value before post-curing.
*[2] An epoxy type multi-layer printed board.

EXAMPLE 4

Two specimens of multi-layer printed circuit board (with three layers of unit circuit sheets) were produced in the same way as Example 1.

Preparation of prepreg resin sheet:

40 Parts of N,N'-4,4'-diaminodiphenylmethanebismaleimide and 13 parts of 4,4'-diaminodiphenylmethane were reacted in 50 parts of methyl Cellosolve at 120° C. for 30 minutes, and this reaction mixture was additionally mixed with 47 parts of a bisphenol A type epoxy resin (epoxy equivalent weight: approx. 188) and further reacted at 90°–110° C. for 30 minutes. Then, after adding and dissolving 8 parts of 2,4-diamino-6-methyl-s-triazine, the reaction mixture was further added with about 58 parts of methyl ethyl ketone to form a varnish with 50% solids. This varnish was then impregnated in an aminocyan-treated glass cloth (0.1 mm thick) to make a prepreg resin sheet with 30–50% resin content.

Figure 3A:
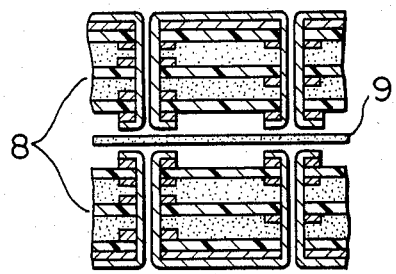
Figure 3B:
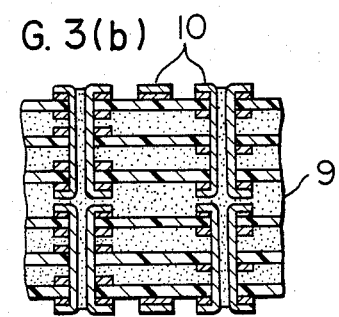

Then said multi-layer printed boards 8 were heat bonded with two said prepreg sheets 9 as shown in FIG. 3(a) to form a multi-layer printed circuit board with six layers of unit circuit sheets as shown in FIG. 3(b), followed by formation of the outermost layer circuits for finishing in the same way as Example 1.

EXAMPLE 5

Figure 4A:
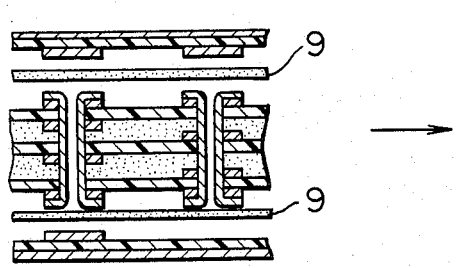
Figure 4B:
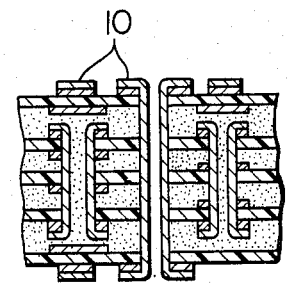

On each side of a multi-layer printed board (with three layers of unit circuit sheets) prepared after the manner of Example 1 was additionally laminated a unit circuit sheet through a prepreg resin sheet 9 completely the same as used in Example 4 as shown in FIG. 4(a), which was followed by heat bonding to form a multi-layer laminate (see FIG. 4(b)). The surface treatment for circuit copper coating before laminate adhesion and the laminate adhering conditions were the same as in Example 1. The properties of the multi-layer printed circuit boards obtained in Examples 4 and 5 were determined in the manner described above and shown in Table 2.

TABLE 2

| Example No. | Glass transition temp. (°C.) | Soldering heat resistance (sec.) | Inner copper foil adhesive strength (g/cm) | Maximum positional shift (μm) |
|---|---|---|---|---|
| Example 4 | 210 | over 180 | 1,200 | 78 |
| Example 5 | 210 | over 180 | 1,300 | 70 |

EXAMPLE 6

A multi-layer printed circuit board was produced by using the same unit circuit sheets as used in Example 1 and prepreg resin sheets produced as mentioned below and performing the laminate molding under the conditions of 180° C., 20 kg/cm² and 100 minutes.

Preparation of prepreg resin sheet 4,4'-Dicyanamidediphenylmethane in an amount of 100 parts was dissolved in 100 parts of methyl ethyl ketone and reacted at 60° C. for 40 minutes to prepare a prepolymer. Then, 0.2 part of 2-ethyl-4-methylimidazole was added to the reaction mixture to give a varnish having the solid content of 50%. This varnish was used for impregnating an aminosilane-treated glass cloth (0.1 mm thick, mfd. by Nitto Boseki Co., Ltd., Japan), followed by drying at 90°-110° C. for 10 minutes to make a prepreg resin sheet with 60% resin content.

EXAMPLE 7

Preparation of unit circuit sheet

The same prepolymer varnish obtained from 4,4'-dicyanamidediphenylmethane as used in Example 6 was used for impregnating an aminosilane-treated glass cloth (0.1 mm thick, mfd. by Nitto Boseki Co., Ltd., Japan), followed by drying at 90°-110° C. for 10 minutes to give a solid content of 50%. The resulting glass cloth was piled with copper foils and subjected to adhesion molding under the conditions of 180° C., 40 kg/cm² and 100 minutes. Forming circuits on the copper foils in the same manner as described in Example 1, a unit circuit sheet (0.27 mm thick and coated with 70 μm copper-foil on both sides) was prepared.

A multi-layer printed circuit board (5 layers of unit circuit sheets) was produced by piling the unit circuit sheets thus produced and the same prepreg resin sheets as used in Example 6 and performing the laminate molding under the conditions of 180° C., 20 kg/cm² and 100 minutes.

Properties of the multi-layer printed circuit boards obtained in Examples 6 and 7 were determined in the same manner as described above and shown in Table 3.

TABLE 3

| Example No. | Curing temp. (at multi-layer adhesion) (°C.) | Glass transition temp. $Tg_1$ (°C.) | Glass transition temp. $Tg_2$ (°C.) | Soldering heat resistance (sec.) | Inner copper foil adhesive strength (g/cm) | Maximum positional shift (μm) |
|---|---|---|---|---|---|---|
| Example 6 | 180 | 220 | 240 | >180 | 1,300 | 75 |
| Example 7 | 180 | 240 | 240 | >180 | 1,400 | 70 |

What is claimed is:

1. A multi-layer printed circuit board produced by laminating a plurality of unit circuit sheets having circuit layers on at least one surface of said unit circuit sheets in which a resin composition has been impregnated and cured via prepreg resin sheets, said prepreg resin sheets having been prepared by impregnating reinforcing substrates with a polyimide resin composition which can be cured at a temperature equal to or lower than both the glass transition temperature ($Tg_1$) of the cured resin in the unit circuit sheets and the glass transition temperature ($Tg_2$) of the resin in the prepreg resin sheets after cured, and binding the laminated sheets with heating under pressure at a temperature equal to or lower than both the temperatures of $Tg_1$ and $Tg_2$.

2. A multi-layer printed circuit board according to claim 1, wherein both the temperatures of $Tg_1$ and $Tg_2$ are 170° C. or higher.

3. A multi-layer printed circuit board according to claim 1, wherein said resin composition has a curing temperature between 160°-180° C., and wherein said binding with heating is performed at a temperature of 160°-180° C. to cure the resin in the prepreg sheets.

4. A multi-layer printed circuit bard according to claim 1, wherein said polyimide resin composition is impregnated into the reinforcing substrates as a varnish of the polyimide resin composition in an organic solvent.

5. A multi-layer printed circuit board according to claim 1, wherein the polyimide resin with which said reinforcing substrates has been impregnated is a resin composition selected from the group consisting of (a) a composition containing dicyanamide, or dicyanamide and an imidazole or an aromatic diamine, or a prepolymer thereof; and (b) a composition containing a polymaleimide, an aromatic diamine, an epoxy resin and a s-triazine amine compound, or a prepolymer thereof.

6. A multi-layer printed circuit board produced by laminating a plurality of unit circuit sheets having circuit layers on at least one surface of said unit circuit sheets in which a resin composition has been impregnated and cured via prepreg resin sheets, said prepreg resin sheets having been preprared by impregnating reinforcing substrates with a resin composition which can be cured at a temperature equal to or lower than both the glass transition temperature ($Tg_1$) of the cured resin in the unit circuit sheets and the glass transition temperature ($Tg_2$) of the resin in the prepreg resin sheets after cured, and binding the laminated sheets with heating under pressure at a temperature equal to or lower than both the temperatures of $Tg_1$ and $Tg_2$, and wherein the resin composition for at least the prepreg resin sheet comprises:

(I) a prepolymer obtained by preliminarily reacting with heating (a) a bisimide of the formula

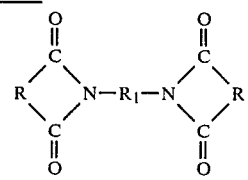

(1)

wherein R is a divalent organic group having at least one carbon-carbon double bond; and $R_1$ is a divalent organic group having at least two carbon atoms, and (b) a diamine of the formula:

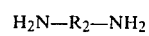

(2)

wherein $R_2$ is a divalent organic group having at least two carbon atoms, (II) an epoxy resin, and (III) at least one amine selected from the group consisting of a s-triazine type amine compound of the formula:

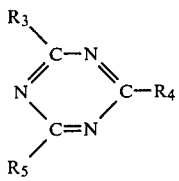  (3)

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide.

7. A multi-layer printed circuit board according to claim 6, wherein the amine is benzoguanamine, 2,4-diamino-s-triazine, 2,4-diamino-6-methyl-s-triazine, melamine, or dicyandiamide.

8. A multi-layer printed circuit board produced by laminating a plurality of unit circuit sheets having circuit layers on at least one surface of said unit circuit sheets in which a resin composition has been impregnated and cured via prepreg resn sheets, said prepreg resin sheets having been prepared by impregnating reinforcing substrates with a polyimide resin composition which can be cured at a temperature equal to or lower than both the glass transition temperature ($Tg_1$) of the cured resin in the unit circuit sheets and the glass transition temperature ($Tg_2$) of the resin in the prepreg resin sheets after cured, and binding the laminated sheets with heating under pressure at a temperature equal to or lower than both the temperatures of $Tg_1$ and $Tg_2$, and wherein the resin used in the resin composition for impregnating the unit circuit sheets is selected from the group consisting of addition polymerization polyimide resins, dehydration condensation polyimide resins, triazine resins and cyanate resins.

9. A multi-layer printed circuit board produced by laminating a plurality of unit circuit sheets having circuit layers on at least one surface of said unit circuit sheets in which a resin composition has been impregnated and cured via prepreg resin sheets, said prepreg resin sheets having been prepared by impregnating reinforcing substrates with a resin composition which can be cured at a temperature equal to or lower than both the glass transition temperature ($Tg_1$) of the cured resin in the unit circuit sheets and the glass transition temperature ($Tg_2$) of the resin in the prepreg resin sheets after cured, and binding the laminated sheets with heating under pressure at a temperature equal to or lower than both the temperatures of $Tg_1$ and $Tg_2$, and wherein the resin composition for at least the prepreg resin sheet comprises:

(I) a prepolymer obtained by preliminarily reacting with heating (a) a bisimide of the formula

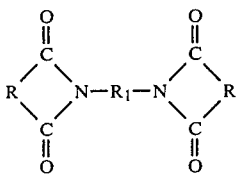  (1)

wherein R is a divalent organic group having at least one carbon-carbon double bond; and $R_1$ is a divalent organic group having at least two carbon atoms, and (b) a diamine of the formula:

$H_2N—R_2—NH_2$  (2)

wherein $R_2$ is a divalent organic group having at least two carbon atoms, (II) an epoxy resin, and (III) at least one amine selected from the group consisting of a s-triazine type amine compound of the formula:

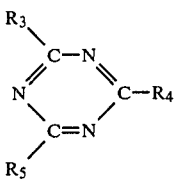  (3)

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide, and wherein the resin used in the resin composition for impregnating the unit circuit sheets is selected from the group consisting of addition polymerization polyimide resins, dehydration condensation polyimide resins, triazine resins and cyanate resins.

10. A prepreg resin sheet prepared by impregnating a reinforcing substrate with a polyimide resin composition which can be cured at a temperature equal to or lower than the glass transition temperature ($Tg_2$) of the resin after cured, said $Tg_2$ being 170° C. or higher.

11. A prepreg resin sheet prepared by impregnating a reinforcing substrate with a polyimide resin composition which can be cured at a temperature equal to or lower than the glass transition temperature ($Tg_2$) of the resin after cured, said $Tg_2$ being 170° C. or higher, and wherein the resin composition comprises:

(I) a prepolymer obtained by preliminarily reacting with heating (a) a bisimide of the formula:

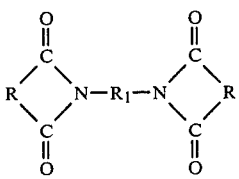  (1)

wherein R is a divalent organic group having at least one carbon-carbon double bond; and $R_1$ is a divalent organic group having at least two carbon atoms, and (b) a diamine of the formula:

$$H_2N-R_2-NH_2 \qquad (2)$$

wherein $R_2$ is a divalent organic group having at least two carbon atoms, (II) an epoxy resin, and (III) at least one amine selected from the group consisting of a s-triazine type amine compound of the formula:

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide.

12. A prepreg resin sheet according to claim 11, wherein the amine is benzoganamine, 2,4-diamino-s-triazine, 2,4-diamino-6-methyl-s-triazine, or dicyandiamide.

13. A prepreg resin sheet according to claim 11, wherein R has 2 to 10 carbon atoms, $R_1$ has 2 to 40 carbon atoms, and $R_2$ has 2 to 40 carbon atoms.

14. A prepreg resin sheet according to claim 11, wherein the bisimide of (a) is at least one selected from the group consisting of N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-4,4'-diphenylsufonebismaleimide, N,N'-4,4'-dicyclohexylmethanebismaleimide, N,N'-α,α'-4,4'-dimethylenecyclohexanebismaleimide, N,N'-m-methaxylenebismaleimide, N,N'-4,4'-diphenylcyclohexanebismaleimide, and N,N'-methylenebis(3-chloro-p-phenylene)bismaleimide; the diamine (b) is at least one selected from the group consisting of 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, benzidine, 4,4'-diaminophenyl oxide, 4,4'-diaminodiphenylsulfone, bis(4-aminophenyl)phenylphosphone oxide, bis(4-aminophenyl)methylamine, 1,5-diaminonaphthalene, m-xylenediamine, p-xylenediamine, hexamethylenediamime, 6,6'-diamine-2,2'-pyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazo(4,5-d)thiazole, 5,5'-di(m-aminophenyl)-(2,2')-bis-(1,3,4-oxadiazolyl), 4,4'-diaminodiphenylether, 4,4'-bis(p-aminophenyl)-2,2'-dithiazole, m-bis(4-p-aminophenyl-2-thiazolyl)benzene, 4,4'-diaminobenzanilide, 4,4'-diaminophenyl benzoate, N,N'-bis(4-aminobenzyl)-p-phenylenediamine, and 4,4'-methylenebis(2-chloroaniline); the epoxy resin of (II) is at least one selected from the group consisting of bisphenol A diglycidyl ether, 3,4-epoxycyclohexylmethyl-3,4-epoxycyclohexane carboxylate, 4,4'-(1,2-epoxyethyl)biphenyl, 4,4'-di(1,2-epoxyethyl)diphenyl ether, resorcindiglycidyl ether, bis(2,3-epoxycyclopentyl)ether, N,N'-m-phenylenebis(4,5'-epoxy-1,2-cyclohexanedicarboxyimide), triglycidyl compounds of p-aminophenol, 1,3,5-tri(1,2-epoxyethyl)benzene, tetraglycidoxytetraphenylethane, and polyglycidyl ether of phenol-formaldehyde novolak resin; and the amine of (III) is at least one selected from the group consisting of melamine, 2-amino-s-triazine, 2-amino-4-phenyl-s-triazine, 2-amino-4-phenyl-s-triazine, 2-amino-4,6-diethyl-s-triazine, 2-amino-4,6-diphenyl-s-triazine, 2-amino-4,6-bis(p-methoxyphenyl)-s-triazine, 2-amino-4-anilino-s-triazine, 2-amino-4-phenoxy-s-triazine, 2-amino-4-chloro-s-triazine, 2-amino-4-aminomethyl-6-chloro-s-triazine, 2-(p-aminophenyl)-4,6-dichloro-s-triazine, 2,4-diamino-s-triazine, 2,4-diamino-6-methyl-s-triazine, 2,4-diamino-6-phenyl-s-triazine, 2,4-diamino-6-benzyl-s-triazine, 2,4-diamino-6-(p-aminophenyl)-s-triazine, 2,4-diamino-6-(m-aminophenyl)-s-triazine, 4-amino-6-phenyl-s-triazine-2-ol, and 6-amino-s-triazine-2,4-diol.

15. A prepreg resin sheet according to claim 14, wherein a polyvalent maleimide of the following formula:

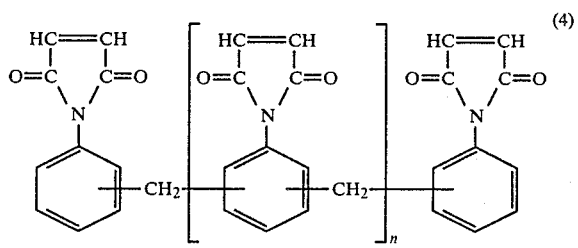

wherein n is 0.1 to 3.0 on the average, is used with the bismaleimide of (a).

16. A prepreg resin sheet prepared by impregnating a reinforcing substrate with a polyimide resin composition which can be cured at a temperature equal to or lower than the glass transition temperature ($Tg_2$) of the resin after cured, said $Tg_2$ being 170° C. or higher, and wherein the resin used in the resin composition for impregnating the unit circuit sheets is selected from the group consisting of addition polymerization polyimide resins, dehydration condensation polyimide resins, triazine resins and cyanate resins.

17. A prepreg resin sheet prepared by impregnating a reinforcing substrate with a polyimide resin composition which can be cured at a temperature equal to or lower than the glass transition temperature ($Tg_2$) of the resin after cured, said $Tg_2$ being 170° C. or higher, and wherein the resin composition comprises:

(I) a prepolymer obtained by preliminarily reacting with heating (a) a bisimide of the formula:

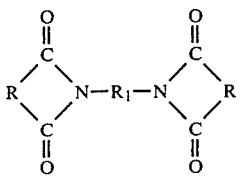

(1)

wherein R is a divalent organic group having at least one carbon-carbon double bond; and $R_1$ is a divalent organic group having at least two carbon atoms, and (b) a diamine of the formula:

$$H_2N—R_2—NH_2 \quad (2)$$

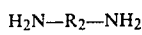

wherein $R_2$ is a divalent organic group having at least two carbon atoms, (II) an epoxy resin, and (III) at least one amine selected from the group consisting of a s-triazine type amine compound of the formula:

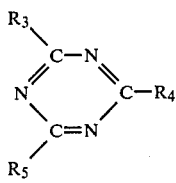

(3)

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide, and wherein the resin used in the resin composition for impregnating the unit circuit sheets is selected from the group consisting of addition polymerization polyimide resins, dehydration condensation polyimide resins, triazine resins and cyanate resins.

18. A combined material system for producing a multi-layer printed circircuit board comprising
(i) at least one unit circuit sheet having circuit layers on at least one surface of said sheet in which a resin composition has been impregnated and cured, said cured resin having a glass transition temperature ($Tg_1$) of 170° C. or higher, and
(ii) at least one prepreg resin sheet having been prepared by impregnating a reinforcing substrate with a polyimide resin composition which can be cured at a temperature equal to or lower than both the glass transition temperature of $Tg_1$ and the glass transition temperature ($Tg_2$) of the resin in the prepreg resin sheet after cured, said $Tg_2$ being 170° C. or higher.

19. A combined material system for producing a multi-layer printed circuit board comprising:
(i) at least one unit circuit sheet having circuit layers on at least one surface of said sheet in which a resin composition has been impregnated and cured, said cured resin having a glass transition temperature ($Tg_1$) of 170° C. or higher, and
(ii) at least one prepreg resin sheet having been prepared by impregnating a reinforcing substrate with a resin composition which can be cured at a temperature equal to or lower than both the glass transition temperature of $Tg_1$ and the glass transition temperature ($Tg_2$) of the resin in the prepreg resin sheet after cured, said $Tg_2$ being 170° C. or higher, and wherein the resin composition for at least the prepreg resin sheet comprises:
(I) a prepolymer obtained by preliminarily reacting with heating
(a) a bisimide of the formula:

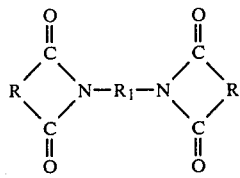

(1)

wherein R is a divalent organic group having at least one carbon-carbon double bond; and $R_1$ is a divalent organic group having at least two carbon atoms, and (b) a diamine of the formula:

$$H_2N—R_2—NH_2 \quad (2)$$

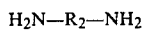

wherein $R_2$ is a divalent organic group having at least two carbon atoms;

(II) an epoxy resin; and (III) at least one amine selected from the group consisting of a s-triazine type amine compound of the formula:

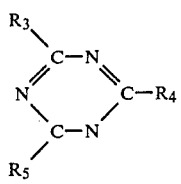

(3)

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide.

20. A combined material system according to claim 19, wherein the amine is benzoguanamine, 2,4-diamino-s-triazine, 2,4-diamino-6-methyl-s-triazine, melamine, or dicyandiaminde.

21. A combined material system according to claim 19, wherein the resin composition is a polyimide resin composition, and the polyimide resin composition is impregnated into the reinforcing substrate as a varnish of the polyimide resin composition in an organic solvent.

22. A combined material system for producing a multi-layer printed circuit board comprising:
(i) at least one unit cirucuit sheet having circuit layers on at least one surface of said sheet in which a resin composition has been impregnated and cured, said cured resin having a glass transition temperature ($Tg_1$) of 170° C. or higher, and (ii) at least one prepreg resin sheet having been prepared by impregnating a reinforcing substrate with a resin composition which can be cured at a temperature equal to or lower than both the glass transition temperature of $Tg_1$ and the glass transition temperature ($Tg_2$) of the resin in the prepreg resin sheet after cured, said $Tg_2$ being 170° C. or higher, and wherein the unit circuit sheet contains a polyimide resin and the prepreg resin sheet contains a resin composition comprising:

(I) a prepolymer obtained by preliminarily reacting with heating (a) a bisimide of the formula:

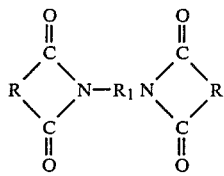
(1)

wherein R is a divalent organic group having at least one carbon-carbon double bond; and $R_1$ is a divalent organic group having at least two carbon atoms; and (b) a diamine of the formula:

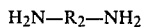
(2)

wherein $R_2$ is a divalent organic group having at least two carbon atoms, (II) an epoxy resin, and (III) at least one amine selected from the group consisting of a s-triazine type amine compound of the formula:

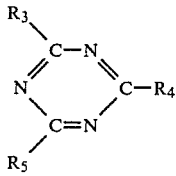
(3)

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide.

23. A combined material system according to claim 22, wherein the amine is benzoguanamine 2,4-diamino-s-triazine, 2,4-diamino-6-methyl-s-triazine, melamine, or dicyandiamide.

24. A combined material system for producing a multi-layer printed circuit board comprising (i) at least one unit circuit sheet having circuit layers on at least one surface of said sheet in which a resin composition has been impregnated and cured, said cured resin having a glass transition temperature ($Tg_1$) of 170° C. or higher, and (ii) at least one prepreg resin sheet having been prepared by impregnating a reinforcing substrate with a polyimide resin composition which can be cured at a temperature equal to or lower than both the glass transition temperature of $Tg_1$ and the glass transition temperature ($Tg_2$) of the resin in the prepreg resin sheet after cured, said $Tg_2$ being 170° C. or higher, and wherein the resin used in the resin composition for impregnating the unit circuit sheets is selected from the group consisting of addition polymerization polyimide resins, dehydration condensation polyimide resins, triazine resins and cyanate resins.

25. A combined material system for producing a multi-layer printed circuit board comprising:

(i) at least one unit circuit sheet having circuit layers on at least one surface of said sheet in which a resin composition has been impregnated and cured, said cured resin having a glass transition temperature ($Tg_1$) of 170° C. or higher, and (ii) at least one prepreg resin sheet having been prepared by impregnating a reinforcing substrate with a resin composition which can be cured at a temperature equal to or lower than both the glass transition temperature of $Tg_1$ and the glass transition temperature ($Tg_2$) of the resin in the prepreg resin sheet after cured, said $Tg_2$ being 170° C. or higher, and wherein the resin composition for at least the prepreg resin sheet comprises:

(I) a prepolymer obtained by preliminarily reacting with heating (a) a bisimide of the formula:

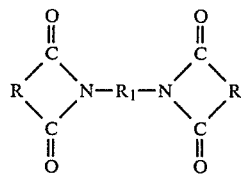
(1)

wherein R is a divalent organic group having at least one carbon-carbon double bond; and $R_1$ is a divalent organic group having at least two carbon atoms, and (b) a diamine of the formula:

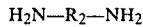
(2)

wherein $R_2$ is a divalent organic group having at least two carbon atoms;

(II) an epoxy resin; and (III) at least one amine selected from the group consisting of a s-triazine type amine compound of the formula:

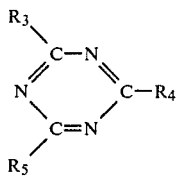
(3)

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide, and wherein the resin used in the resin composition for impregnating the unit circuit sheets is selected from the group consisting of addition polymerization polyimide resins, dehydration condensation polyimide resins, triazine resins, and cyanate resins.

26. A process for producing a multi-layer circuit board which comprises laminating a plurality of unit circuit sheets having circuit layers on at least one surface of said unit circuit sheets in which a resin composition has been impregnated and cured, via prepreg resin sheets, said prepreg resin sheets having been prepared by impregnating a reinforcing substrate with a polyimide resin composition which can be cured at a temperature equal to or lower than both the glass transition temperature ($Tg_1$) of the cured resin in the unit circuit sheets and the glass transition temperature ($Tg_2$) of the resin in the prepreg resin sheets after cured, and binding the laminated sheets with heating underpressure of 5 to 30 Kg/cm$^2$ and at a temperature equal to or lower than 180° C. and both the temperatures of $Tg_1$ and $Tg_2$.

27. A process according to claim 26, wherein both the temperatures of $Tg_1$ and $Tg_2$ are 170° C. or higher.

28. A process according to claim 26, wherein the polyimide resin composition is impregnated into the reinforcing substrate as a varnish of the polyimide resin composition in an organic solvent.

29. A process according to claim 26, wherein the polyimide resin composition with which the reinforcing substrate has been impregnated is a resin composition selected from the group consisting of (a) a composition containing dicyanamide, or dicyanamide and an imidazole or an aromatic diamine, or a prepolymer thereof; and (b) a composition containing a polymaleimide, an aromatic diamine, an epoxy resin and a s-triazine amine compound, or a prepolymer thereof.

30. A process according to claim 26, wherein the pressure for binding the laminated sheets is 5 to 30 kg/cm$^2$.

31. Product formed by the process of claim 26.

32. A process according to claim 26, wherein the resin composition for at least the prepreg resin sheet comprises (I) a prepolymer obtained by preliminarily reacting with heating (a) a bisimide of the formula:

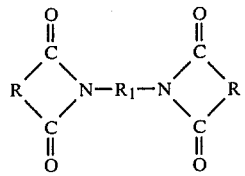
(1)

wherein R is a divalent organic group having at least one carbon-carbon double bond; and $R_1$ is a divalent organic group having at least two carbon atoms, and (b) a diamine of the formula:

$$H_2N-R_2-NH_2 \quad (2)$$

wherein $R_2$ is a divalent organic group having at least two carbon atoms, (II) an epoxy resin, and (III) at least one amine selected from the group consisting of a s-triazine type amine compound of the formula:

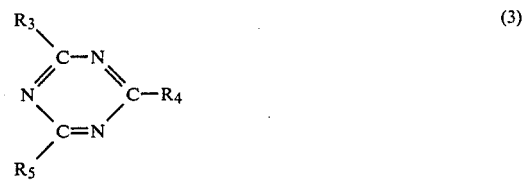
(3)

wherein $R_3$, $R_4$ and $R_5$ are independently hydrogen, halogen, a hydrocarbon group, an amino group, a hydroxyl group, an amino-substituted hydrocarbon group, a hydroxyl-substituted hydrocarbon group, or a hydrocarbon-substituted amino group, and at least one of $R_3$, $R_4$ and $R_5$ being an amino group or an amino-substituted hydrocarbon group, and dicyandiamide.

33. Product formed by the process of claim 32.

34. A process according to claim 26, wherein said binding is achieved by curing the resin in the prepreg resin sheets with said heating under pressure.

35. A process according to claim 34, wherein the curing is performed at a temperature of 160°–180° C.

* * * * *